United States Patent
Kraus et al.

(10) Patent No.: US 10,141,860 B2
(45) Date of Patent: Nov. 27, 2018

(54) CONVERTER WITH DC LINK

(71) Applicant: Siemens Aktiengesellschaft, Munich (DE)

(72) Inventors: Ludwig Kraus, Ruhstorg (DE); Dario Meraviglia, Adelsdorf (DE); Gopal Mondal, Erlangen (DE); Matthias Neumeister, Nuremberg (DE)

(73) Assignee: SIEMENS AKTIENGESELLSCHAFT, Munich (DE)

(*) Notice: Subject to any disclaimer, the term of this patent is extended or adjusted under 35 U.S.C. 154(b) by 0 days.

(21) Appl. No.: 15/433,170

(22) Filed: Feb. 15, 2017

(65) Prior Publication Data

US 2017/0237358 A1    Aug. 17, 2017

(30) Foreign Application Priority Data

Feb. 15, 2016  (EP) ..................... 16155697

(51) Int. Cl.
*H05K 7/20*  (2006.01)
*H02M 7/00*  (2006.01)
(Continued)

(52) U.S. Cl.
CPC .......... *H02M 7/003* (2013.01); *H05K 5/0017* (2013.01); *H05K 5/0021* (2013.01);
(Continued)

(58) Field of Classification Search
CPC . G06F 1/181–1/182; H05K 7/20218–7/20381;
(Continued)

(56) References Cited

U.S. PATENT DOCUMENTS 5,469,331 A  * 11/1995  Conway ............. H05K 7/20254
                                                                 165/80.3
6,867,970 B2    3/2005  Müller et al. ................. 361/695
(Continued)

FOREIGN PATENT DOCUMENTS

DE    10153748 A1    5/2003    ............... H02M 7/00
EP    1965424 A2    9/2008    ........... H01L 23/473
(Continued)

OTHER PUBLICATIONS

RU 2412523 C2, US 2007/0048574 A1.
(Continued)

*Primary Examiner* — Anthony Haughton
*Assistant Examiner* — Razmeen Gafur
(74) *Attorney, Agent, or Firm* — Slayden Grubert Beard PLLC

(57) ABSTRACT

A converter with a DC link for converting an input voltage into an alternating voltage with a pre-determined amplitude and frequency for driving a single or multiple-phase load may include a number of modules which are stackable over one another. Each module may have a ceramic cooling body with a receiving surface on which electronic components of one phase are mounted, wherein the ceramic cooling body has channel(s) in the region of the receiving surface for carrying a coolant during the operation of the converter The converter may include a DC link capacitor and input-side and output-side power connections arranged on a first carrier having a arranged perpendicular to the receiving surface. The converter may also include a control unit for driving the electronic components of the phase, the control unit being arranged on a second carrier having a main plane arranged perpendicularly to the plane of the receiving surface.

16 Claims, 12 Drawing Sheets

(51) Int. Cl.
*H05K 5/00* (2006.01)
*H05K 5/02* (2006.01)
*H05K 5/03* (2006.01)
*H05K 7/14* (2006.01)
*H01L 23/473* (2006.01)

(52) U.S. Cl.
CPC .............. *H05K 5/0247* (2013.01); *H05K 5/03* (2013.01); *H05K 7/1432* (2013.01); *H05K 7/209* (2013.01); *H05K 7/20254* (2013.01); *H05K 7/20927* (2013.01)

(58) Field of Classification Search
CPC ............... H05K 7/20409–7/20418; H05K 7/20009–7/202; H01L 23/367–23/3677; H01L 23/473; H01L 23/46–23/467
USPC ....... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | | |
|---|---|---|---|---|
| 8,630,092 B2 | 1/2014 | Kluge | | 361/713 |
| 9,320,182 B2 | 4/2016 | Steger et al. | | |
| 2004/0022041 A1* | 2/2004 | Bergmann | H02M 7/003 | 361/784 |
| 2005/0030717 A1* | 2/2005 | Inagaki | H01L 23/4334 | 361/699 |
| 2005/0259402 A1* | 11/2005 | Yasui | H02M 7/003 | 361/716 |
| 2006/0007721 A1* | 1/2006 | Rodriguez | H02M 7/003 | 363/146 |
| 2006/0152085 A1* | 7/2006 | Flett | B60L 9/30 | 307/75 |
| 2007/0048574 A1 | 3/2007 | Aiello et al. | | 429/435 |
| 2007/0165376 A1* | 7/2007 | Bones | H01L 25/162 | 361/688 |
| 2007/0290311 A1* | 12/2007 | Hauenstein | H01L 23/3735 | 257/685 |
| 2008/0264604 A1* | 10/2008 | Campbell | F28F 3/02 | 165/80.4 |
| 2009/0086436 A1* | 4/2009 | Kluge | F21V 29/004 | 361/707 |
| 2009/0109713 A1* | 4/2009 | Schnetzka | H02M 5/4585 | 363/34 |
| 2009/0231811 A1* | 9/2009 | Tokuyama | H01L 23/36 | 361/699 |
| 2011/0134609 A1* | 6/2011 | Folts | H01L 23/4006 | 361/717 |
| 2011/0194247 A1* | 8/2011 | Nakasaka | H01L 23/4093 | 361/689 |
| 2011/0292604 A1* | 12/2011 | Janes | H05K 7/20909 | 361/695 |
| 2011/0317366 A1* | 12/2011 | Fukutani | H01L 25/072 | 361/699 |
| 2012/0008282 A1* | 1/2012 | Ide | H01L 23/4334 | 361/702 |
| 2012/0236500 A1* | 9/2012 | Higuchi | H01L 23/473 | 361/699 |
| 2012/0306213 A1* | 12/2012 | Hubbers | H03K 17/16 | 290/55 |
| 2013/0003301 A1* | 1/2013 | Miyamoto | H01L 23/473 | 361/699 |
| 2013/0075878 A1* | 3/2013 | Delgado | H01L 23/552 | 257/659 |
| 2013/0113074 A1* | 5/2013 | Ebersberger | H01G 2/08 | 257/532 |
| 2014/0035289 A1* | 2/2014 | Eichler | H05K 7/1432 | 290/55 |
| 2014/0098496 A1* | 4/2014 | Nakasaka | H01L 23/473 | 361/699 |
| 2014/0153189 A1* | 6/2014 | Okamura | H05K 1/0213 | 361/688 |
| 2014/0285969 A1* | 9/2014 | Kojima | H01G 2/14 | 361/689 |
| 2014/0313806 A1* | 10/2014 | Shinohara | H05K 7/20927 | 363/141 |
| 2015/0037616 A1* | 2/2015 | Wyatt | H01M 10/625 | 429/7 |
| 2015/0160702 A1* | 6/2015 | Franz | G06F 1/20 | 361/679.47 |
| 2015/0195957 A1* | 7/2015 | Ohoka | H05K 7/20927 | 361/702 |
| 2015/0222195 A1* | 8/2015 | Tachibana | H05K 7/1432 | 361/699 |
| 2015/0289411 A1* | 10/2015 | Kamiya | H05K 7/20927 | 361/701 |
| 2015/0305188 A1* | 10/2015 | Maeda | H05K 7/1432 | 361/728 |
| 2015/0348869 A1* | 12/2015 | Joshi | H01L 23/4735 | 361/700 |
| 2015/0351290 A1* | 12/2015 | Shedd | F25B 23/006 | 361/679.47 |
| 2016/0037654 A1* | 2/2016 | Kosuga | H02M 7/003 | 361/807 |
| 2016/0064304 A1* | 3/2016 | Takano | H01L 23/473 | 361/699 |
| 2016/0064305 A1* | 3/2016 | Kakiuchi | H01L 23/473 | 361/699 |
| 2016/0081202 A1* | 3/2016 | Hetzel | H05K 7/20672 | 361/724 |
| 2016/0157381 A1* | 6/2016 | Takeuchi | H05K 7/20927 | 361/709 |
| 2016/0165758 A1* | 6/2016 | Brunschwiler | H01L 23/367 | 361/700 |
| 2016/0165762 A1* | 6/2016 | Borisov | H02M 5/40 | 361/700 |
| 2018/0040538 A1* | 2/2018 | Schuderer | H01L 23/473 | |
| 2018/0054114 A1* | 2/2018 | Wu | H02M 1/44 | |

FOREIGN PATENT DOCUMENTS

| | | | | |
|---|---|---|---|---|
| EP | 2535928 A2 | 12/2012 | ............ | F25D 27/00 |
| EP | 2587908 A2 | 5/2013 | ............ | H05K 7/20 |
| EP | 2654392 A2 | 10/2013 | ......... | H01L 23/473 |
| JP | 2007258458 A | 10/2007 | ............ | H01L 23/36 |
| RU | 2412523 C2 | 2/2011 | ............. | H02M 7/00 |

OTHER PUBLICATIONS

Russian Office Action, Application No. 2017103733/07, 13 pages, dated Apr. 16, 2018.
DE 10153748 A1, U.S. Pat. No. 6,867,970 B2.
EP 2535928 A2, U.S. Pat. No. 8,630,092 B2.
EP 2654392 A2, U.S. Pat. No. 9,320,182 B2.
European Search Report, Application No. 16155697.2, 6 pages, dated Jun. 21, 2016.

* cited by examiner

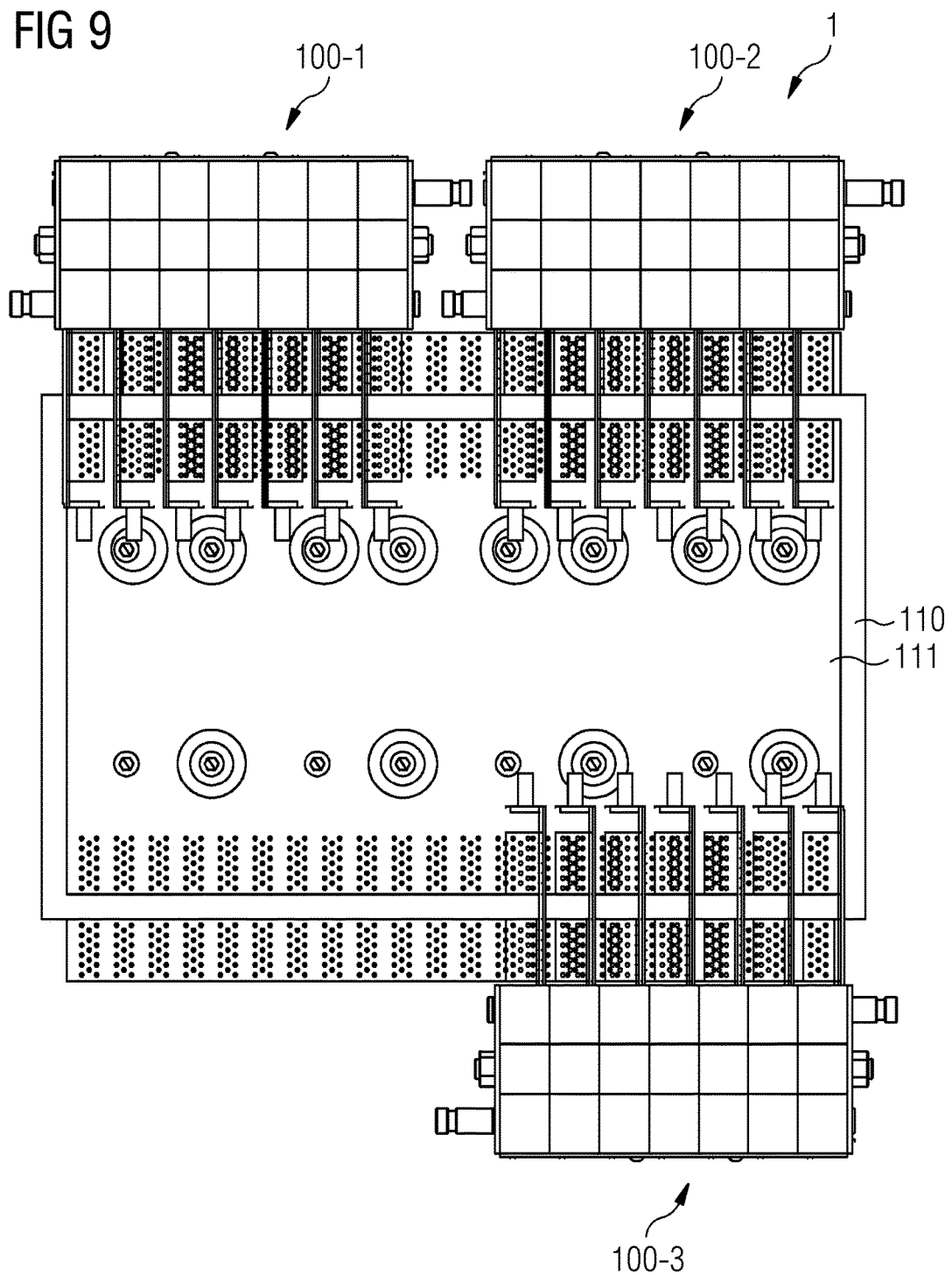

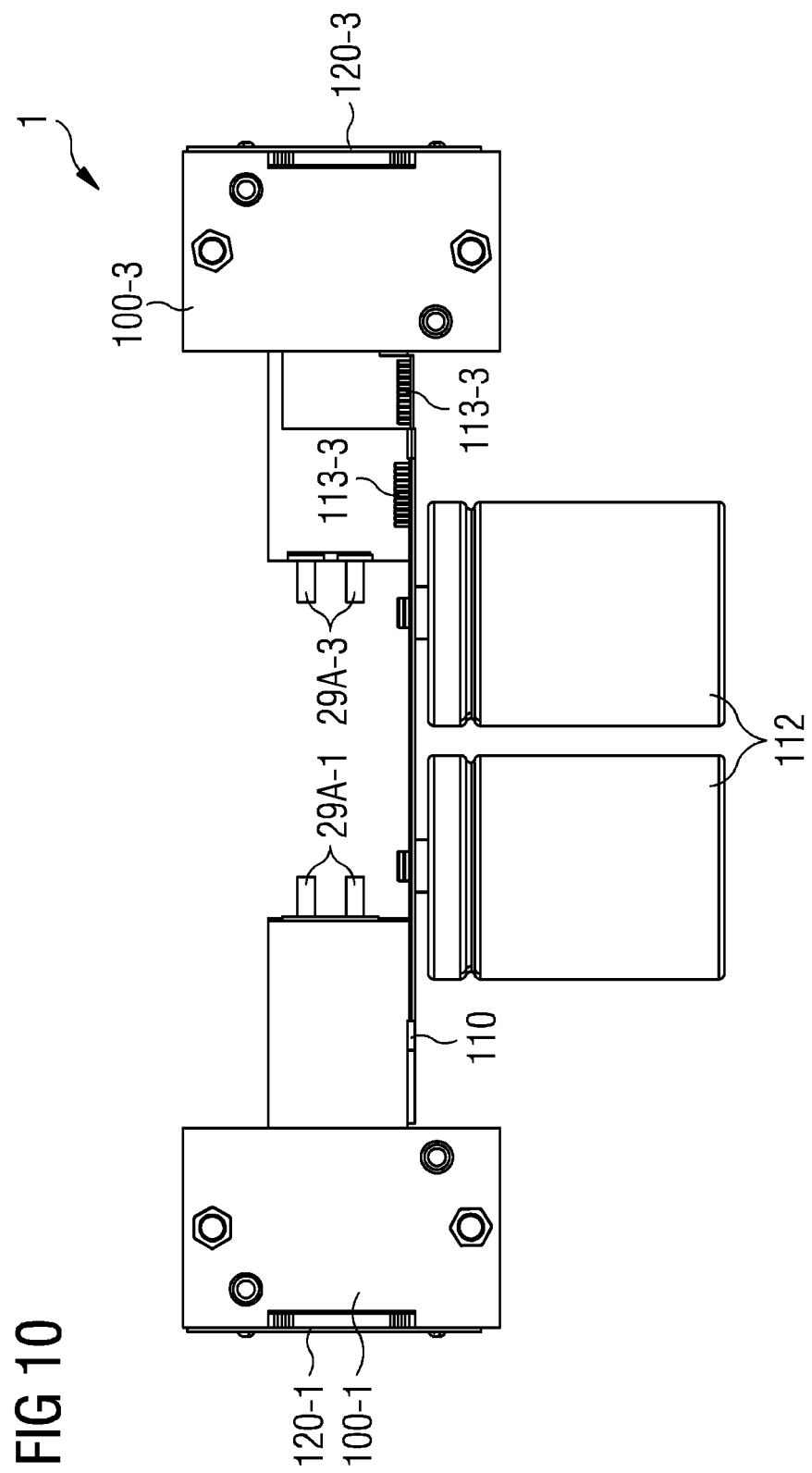

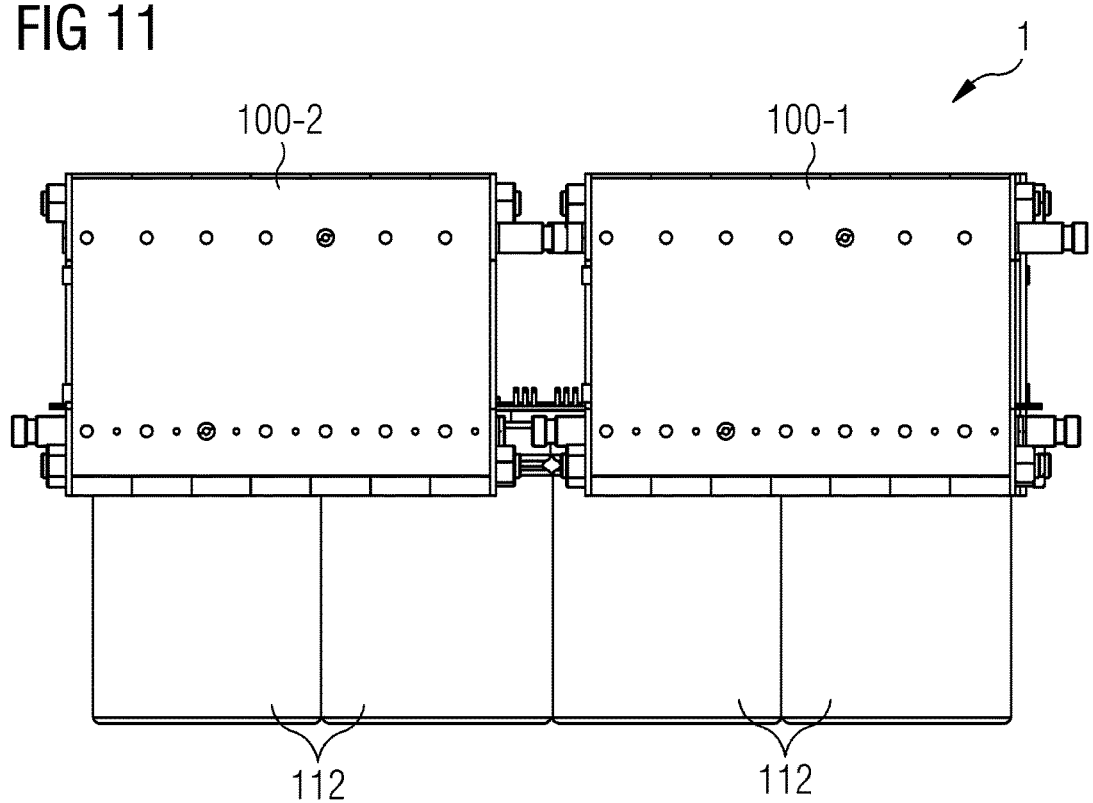

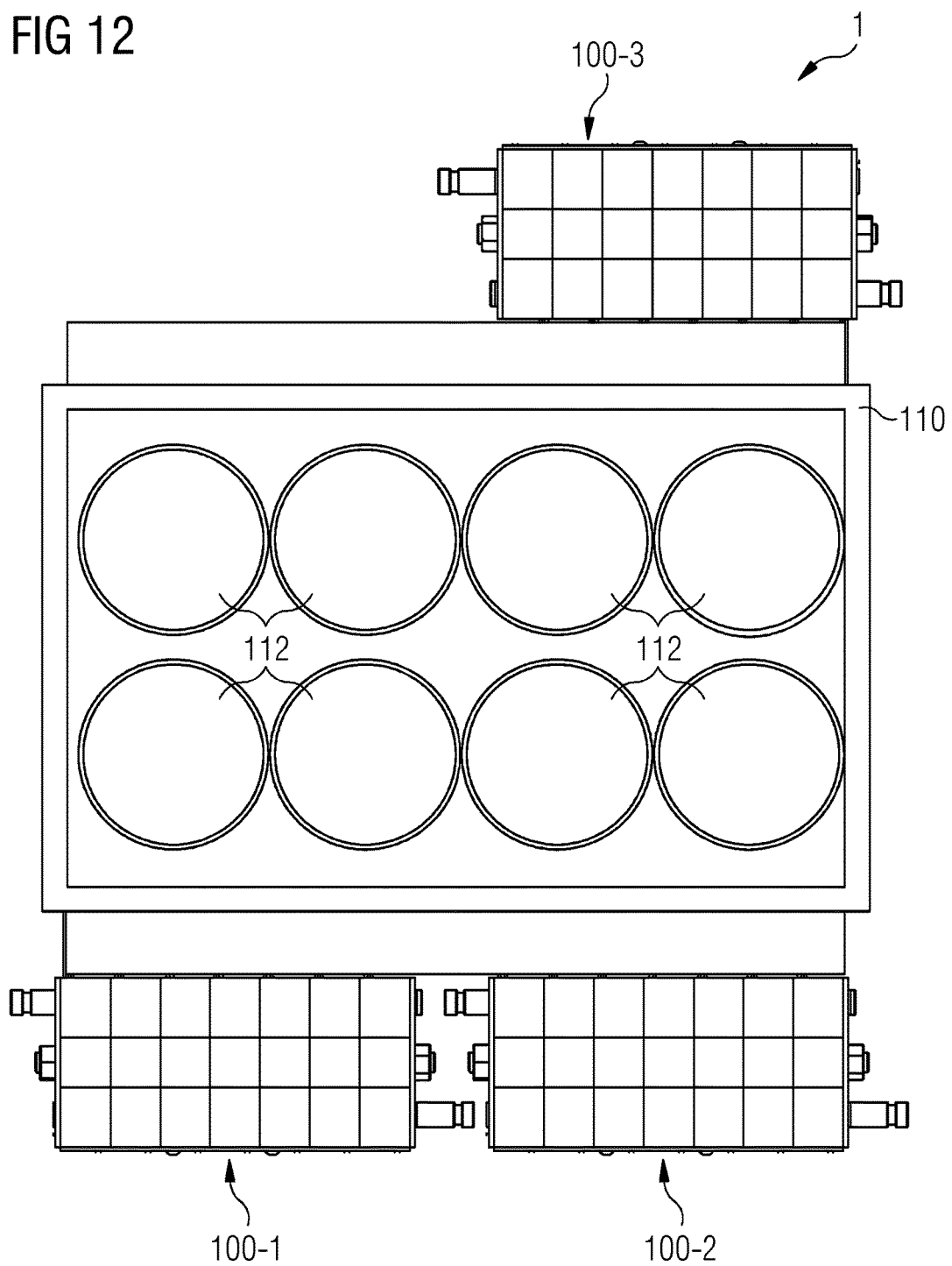

CONVERTER WITH DC LINK

CROSS-REFERENCE TO RELATED APPLICATIONS

This application claims priority to EP Application No. 16155697.2 filed Feb. 15, 2016, the contents of which are hereby incorporated by reference in their entirety.

TECHNICAL FIELD

The invention relates to a converter with a DC link for converting an input voltage into an alternating voltage with a pre-determined amplitude and frequency for driving a single or multiple-phase load.

BACKGROUND

Power modules of modern inverters are cooled with the aid of an air-cooled or water-cooled cooling body which consists of a readily heat-conducting material, e.g. aluminum. For better heat transfer to the cooling body, a carrier made of copper or other materials is fastened to the cooling body with heat-conducting paste. Soldered onto the carrier is a ceramic material provided on both sides with a copper lamination. Arranged on the side of the copper laminated ceramic material facing away from the carrier are the electronic components of the power module. The thickness of the copper laminated ceramic material is herein dependent primarily on the required dielectric strength. At the same time, the thickness of the copper laminated ceramic material determines the heat transmission in the direction toward the cooling body. This means that the higher the power category of a power module, the more difficult the heat removal in the direction of the cooling body becomes.

A further disadvantage lies therein that the contacting of the individual power modules must be correspondingly large, due to the conductive cooling body, in order to maintain the necessary safety margins. A space-saving compact construction is therefore only realizable with difficulty.

SUMMARY

One embodiment provides a converter with a DC link for converting an input voltage into an alternating voltage with a pre-determined amplitude and frequency for driving a single or multiple-phase load, comprising a number of modules which are configured stackable over one another, wherein each module comprises a ceramic cooling body with a receiving surface on which electronic components of one phase are mounted, wherein the ceramic cooling body has one or more channels in the region of the receiving surface through which a coolant can flow during the operation of the converter; at least one DC link capacitor and input-side and output-side power connections which are arranged on a first carrier, the main level of which is arranged perpendicularly to the plane of the receiving surface; a control unit for driving the electronic components of the phase, wherein the control unit is arranged on a second carrier, the main plane of which is arranged perpendicularly to the plane of the receiving surface.

In one embodiment, a structural support is arranged at least on each of two opposing sides of the receiving surface, wherein the structural supports protrude, in a direction perpendicular to the receiving surface, beyond the receiving surface, so that the electronic components then lie in a depression formed between the receiving surface and the structural supports, wherein the structural supports have contact portions for an adjacent module at their ends lying in the extension direction.

In one embodiment, the thickness of the cooling body in the region of the receiving surface in a direction perpendicular to the plane of the receiving surface is between 3 mm and 5 mm.

In one embodiment, the thickness of the structural supports in a direction perpendicular to the plane of the receiving surface is between 15 mm and 20 mm.

In one embodiment, the coolant is supplyable to and removable from the channel or channels of the cooling body via the structural support or supports.

In one embodiment, in the structural support or supports, a common supply channel extending perpendicularly to the plane of the receiving surface is provided for the supply of the coolant to the channel or channels and a common removal channel extending perpendicularly to the plane of the receiving surface is provided for the removal of the coolant, wherein the respective volumes of the common supply channel and the common removal channel are very much greater than the volume of the channel or channels arranged in the region of the receiving surface.

In one embodiment, the structural support or supports are made of a ceramic material and integrally with the cooling body with the receiving surface.

In one embodiment, the structural supports are made of a different material from the cooling bodies with the receiving surface and are connected with a form fit and/or force fit to one another.

In one embodiment, in order to close the depression, provided on each side of the depression is a respective sealing plate, which comprises a passage for control connections or supply and load connections.

In one embodiment, the control connections pass through a first of the sealing plates, wherein the control connections are connected mechanically and electrically outside the module to the second carrier by means of a plug-in connection.

In one embodiment, the supply connections and the load connection pass through a second of the sealing plates, wherein the supply connections are connected mechanically and electrically outside the module to a first main side of the first carrier.

In one embodiment, the DC link capacitor or capacitors are arranged on a second main side of the first carrier.

In one embodiment, a first and a second supply connection are formed by sheet metal rails arranged over one another and separated from one another by means of an insulating layer.

In one embodiment, the load connection is configured as a further sheet metal rail which is guided over the sheet metal rails of the supply connections and is separated from these by means of an insulating layer.

In one embodiment, a plurality of modules arranged over one another are mechanically connected to one another to form a module group.

In one embodiment, the converter comprises a number of module groups corresponding to the number of phases.

In one embodiment, each module group is connected to a respective common second carrier.

In one embodiment, each module group is connected to the first carrier.

BRIEF DESCRIPTION OF THE DRAWINGS

Example aspects and embodiments of the invention are described in greater detail below with reference to the drawings, in which:

FIG. 9 is a plan view of an inventive converter wherein three module groups are fastened to a first carrier to provide respective phases, wherein each of the module groups includes seven modules according to FIGS. 1 to 6 stacked over one another;

FIG. 10 is a view of the converter of FIG. 9 from a side;

FIG. 11 is the converter of FIGS. 9 and 10 in another side view; and

FIG. 12 is the converter of FIGS. 9 to 11 from beneath.

DETAILED DESCRIPTION

Figure 1:
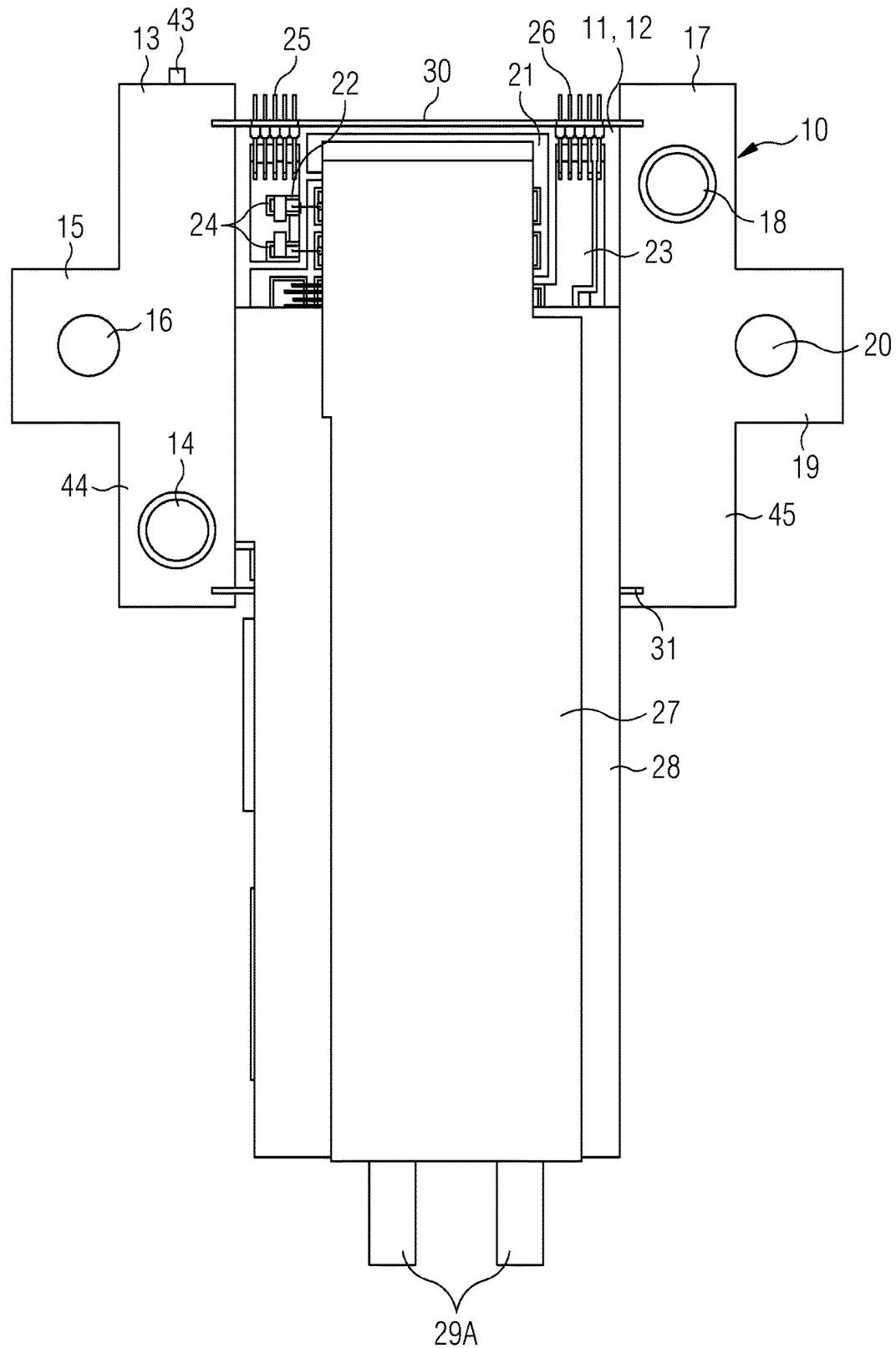
FIG. 1 is a plan view of a module of a converter according to one example embodiment.

Some embodiments of the present invention provide a converter with a DC link for converting an input voltage into an alternating voltage, which can be cooled better and simultaneously has a smaller space requirement.

Some embodiments provide a converter having a number of modules configured stackable over one another. Each module comprises a ceramic cooling body with a receiving surface on which electronic components of one phase are mounted, the ceramic cooling body having one or more channels in the region of the receiving surface through which a coolant can flow during the operation of the converter. The converter further comprises at least one DC link capacitor and input-side and output-side power connections on a first carrier, the main level of which is arranged perpendicularly to the plane of the receiving surface. The converter also comprises a control unit for driving the electronic components of the phase, wherein the control unit is arranged on a second carrier, the main plane of which is arranged perpendicularly to the plane of the receiving surface.

The use of the ceramic cooling body may provide a compact and modular construction of a converter.

In a converter with a plurality of modules stacked over one another, the DC link capacitors associated with the module or modules can be arranged together on the first carrier. Also, with a plurality of modules, a common control unit for driving the electronic components of the respective modules which is arranged on the second carrier can be used.

The stacking capability of a plurality of modules over one another results from the use of an actively cooled ceramic cooling body. In that the cooling body is provided with one or more channels through which coolant can flow during operation of the converter, the conventionally used cooling body made of aluminum can be dispensed with. Also, the conventionally necessary bottom plate which is connected via a heat-conducting paste to the metal cooling body is no longer required. This enables greater degrees of freedom in the configuration of the converter with regard to scaling.

The smaller space requirement as compared with conventional converters results from the use of the ceramic cooling body which enables the DC link capacitor or capacitors to be arranged on the first carrier and the control unit to be arranged on the second carrier, the first and second carrier each being arranged perpendicularly to the plane of the receiving surface. By this means, line lengths between the individual components can be significantly reduced, with the associated advantages of lower leakage inductances. This results in lower switching losses. In particular, it is possible to drive the electronic components of one phase, e.g. a half-bridge, at a higher frequency.

According to one embodiment, a structural support is arranged at least on each of two opposing sides of the receiving surface, wherein the structural supports protrude, in a direction perpendicular to the receiving surface, beyond the receiving surface, so that the electronic components then lie in a depression formed between the receiving surface and the structural supports, wherein the structural supports have contact portions for an adjacent module at their ends lying in the extension direction. The structural supports enable a robust mechanical construction of the cooling body. Furthermore, the supply and removal of the coolant, in particular for a plurality of modules stacked over one another, can be undertaken via the structural supports. This facilitates the cooling of the electronic components of the converter.

According to one embodiment, the thickness of the cooling body in the region of the receiving surface in a direction perpendicular to the plane of the receiving surface is between 3 mm and 5 mm. The thickness of the structural supports in a direction perpendicular to the plane of the receiving surface is suitably between 15 mm and 20 mm. This means that the height of a single module is between 15 mm and 20 mm and corresponds to the thickness of the structural support. If, for example, a plurality of modules is to be switched in parallel, this can take place by means of stacking the desired number of modules over one another. By this means, a module combination with a particular number of individual modules is produced which are connected to a common cooling system. At the same time, a compact construction is achieved, the height of which depends on the number of modules stacked over one another. The number of modules stacked over one another can, as described above, be associated with the common first carrier or with the DC link capacitor or capacitors and the common second carrier with the common control unit and can be connected to said control unit.

According to a further embodiment, the coolant is supplyable to and removable from the channel or channels of the cooling body via the structural support or supports. It is particularly suitable if the coolant is supplied to the channel or channels of the cooling body via one of the structural supports and is removed from the channels of the cooling body via the other of the two structural supports.

According to a further embodiment, in the structural support or supports, a common supply channel extending perpendicularly to the plane of the receiving surface is provided for the supply of the coolant to the channel or channels and a common removal channel extending perpendicularly to the plane of the receiving surface is provided for the removal of the coolant, wherein the respective volumes of the common supply channel and the common removal channel are very much greater than the volume of the channel or channels arranged in the region of the receiving surface. By this means, a good heat removal via the coolant can be provided. In particular, due to the larger volumes of the common supply channel and the common removal channel relative to the volume of the channel or channels, it can be ensured that even for a large number of modules stacked over one another, the electronic components of each individual module can be cooled simultaneously.

According to a further embodiment, the structural supports are made of a ceramic material and integrally with the cooling body with the receiving surface. According to an alternative embodiment, the structural supports are made of a different material from the cooling body with the receiving surface and are connected with a form fit and/or force-fit to one another. Whereas a single piece configuration of the cooling body wherein the structural bodies and the cooling body with the receiving surface are made of a ceramic material, enable an excellent cooling, a variant in which the structural supports are made of another material, for example, aluminum, can be made with lower costs. Herein, the cooling is slightly worse than in the first named variant.

According to a further embodiment, in order to close the depression, provided on each side of the depression is a sealing plate, which comprises a passage for control connections or supply and load connections. Through the provision of the sealing plates, it is ensured that the electronic components provided in the interior of the depression can be protected by simple means against external influences, for example, dirt or moisture. Protection from above herein takes place either by means of another module over the module in question or by means of a separate closing plate.

The control connections may pass through a first of the sealing plates, wherein the control connections are connected mechanically and electrically outside the module to the second carrier by means of a plug-in connection. This results in easy manufacturing of the converter. In particular, the plug-in connection can also be used if a plurality of modules are stacked over one another into a module group.

The supply connections and the load connection pass through a second of the sealing plates, wherein the supply connections are connected mechanically and electrically outside the module to a first main side of the first carrier. It is herein suitable if the width of the respective supply and load connections extends over a large part of the width of the depression in order to increase the current-carrying capacity through a large surface area of the connections. A large area also favors a rapid switching behavior, that is, operation of the converter at high frequency.

According to a further embodiment, the DC link capacitor or capacitors are arranged on a second main side of the carrier. Conversely, this means that the modules are arranged on the first main side of the first carrier. This results in the compact construction with the low connector lengths for optimizing the inductance.

A first and a second supply connection may be formed by sheet metal rails arranged over one another and separated from one another by means of an insulating layer. In this way, firstly, large currents can be transmitted. Secondly, the sheet metal rails can be provided in a simple and cost-effective manner. The parallel arrangement of the sheet metal rails of the first and second supply connection results in a capacitive effect between the supply connections. In this way, the reduction of parasitic inductances can be achieved in the desired manner. This also enables the aforementioned large area current conduction in order to provide a large current carrying capacity, low losses and a rapid switching behavior. Further, through the parallel arrangement of the sheet metal rails, an eddy current effect is advantageously utilized.

According to a further embodiment, the load connection is configured as a further sheet metal rail which is guided over the sheet metal rails of the supply connections and is separated from these by means of an insulating layer. This arrangement enables a simple and mechanically robust construction. Furthermore, a high current carrying capacity of the load connection can also be ensured.

According to a further embodiment, a plurality of modules arranged over one another are mechanically connected to one another to form a module group. For example, the modules of the module group can be pressed into the group by means of threaded rods. The threaded rods can be guided, for example, by means of bores in the structural supports. As mentioned above, it is not required in a module group that a separate control unit and firmly associated DC link capacitors are provided for each module. Rather these functional units can be provided together for all the modules of the module group, in particular if the modules are to be driven and switched electrically in parallel.

The converter may comprise a number of module groups corresponding to the number of phases.

According to another embodiment, each module group is connected to a common second carrier. The second carrier is preferably present in the Euroformat, regardless of the number of modules of the module group connected to one another.

According to a further embodiment, all the module groups of the converter are mechanically and electrically connected to the first carrier. Thus, for example, it can be provided in a B6 bridge circuit that all DC link capacitors are connected to the first carrier.

FIGS. 1 to 6 show an exemplary embodiment of a module 10 according to the invention which, individually or combined stacked over one another into a module group, can be used in an inventive converter with a DC link for converting an input voltage into an alternating voltage with a predetermined amplitude and frequency for driving a single or multiple-phase load (not shown in the drawings).

The same elements have the same reference characters in the figures.

FIG. 1 shows a plan view of the module 10. The module 10 comprises a ceramic cooling body 11 with a receiving surface 12. In the representation of FIG. 1, the receiving surface 12 extends parallel to the drawing plane. Conductive regions 21, 22, 23 are applied to the receiving surface 12, on which a plurality of electronic components 24 are mounted. The electronic components 24 are, for example, one or more semiconductor switching elements, as well as one or more diodes. By means of the receiving surface 12, a connection of the electronic components between one another can be undertaken. For this purpose, the connection of the electronic components is carried out in a manner known to persons skilled in the art, for example, with the aid of conductive wires (bonding wires) which either connect electronic components 24 to one another directly or connect an electronic component 24 to a conductive region 21, 22, 23 on the receiving surface 12. In the module 10, the electronic components 24 are connected such that they form a branch of a phase of the converter. For example, for this purpose, the electronic components 24 can be connected to one another in a half-bridge.

Arranged on each of two opposing sides of the receiving surface 12 of the cooling body 11 made of ceramic material is a respective structural support 13, 17. The structural supports 13, 17 extend in the representation show in FIG. 1 over the whole length of the side edges of the cooling body 11 from top to bottom on the drawing sheet. The structural supports 13, 17 extend in a direction perpendicular to the receiving surface 12, i.e. perpendicularly to the drawing plane beyond the receiving surface 12. By this means, the electronic components 24 are arranged in a depression formed between the receiving surface 12 and the structural supports 13, 17. In the representation shown, the structural supports therefore extend out of the drawing plane in the direction toward the viewer. The portions of the structural supports 13, 17 identified with the reference numerals 44 and 45 form contact portions which face toward the viewer, for an adjacent module. On the opposite sides of the structural supports 13, 17, the structural supports have corresponding contact portions 46, 47, as is clearer from the side views in FIGS. 2 and 3.

Whilst the thickness of the structural supports 13, 17 perpendicular to the plane of the receiving surface is between 15 mm and 20 mm and thus defines the "height" of the module, the thickness of the cooling body 11, in the region of the receiving surface 12 perpendicular to the plane of the receiving surface 12 is between 3 mm and 5 mm. The thickness of the structural support is identified in FIG. 2 as 48, the thickness of the cooling body in the region of the receiving surface is identified with the reference numeral 49.

Not shown in FIGS. 1 to 6 but provided in the ceramic cooling body 11 are channels which extend in the region of the receiving surface (straight, meandering, or similar). During operation of the converter, a coolant, for example water, flows through the channels for cooling the electronic components 24 arranged on the receiving surface 12. The supply and removal of the coolant to or from the channels of the cooling body 11 takes place in the exemplary embodiment described herein by means of the two structural supports 13, 17 arranged on opposite sides of the cooling body. For this purpose, the structural support 13 has a common supply channel 14 and the structural support 17 has a common removal channel 18. The common supply channel 14 and the common removal channel 18 extend perpendicularly to the plane of the receiving surface 12. The common supply channel 14 and the common removal channel 18 are fluidically connected (not shown in the drawings) in a suitable manner to the channels of the cooling body 11. It is herein suitable if the respective volume of the common supply channel 14 and the common removal channel 18 are very much larger than the volume of the channel or channels arranged in the region of the receiving surface 12 of the cooling body 11 in order to ensure good removal of the heat generated by the electronic components. For this purpose, the common supply channel 14 and the common removal channel 18 can be connected in the interior of the relevant structural support 13, 17 to a corresponding cavity or can transition there into.

Figure 2:
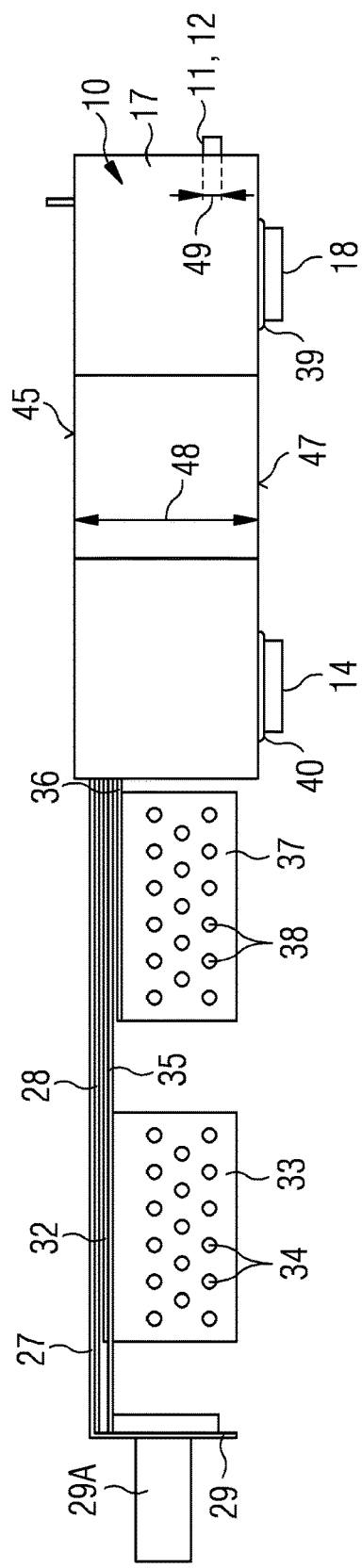
FIG. 2 is a side view of the module of FIG. 1.
Figure 3:
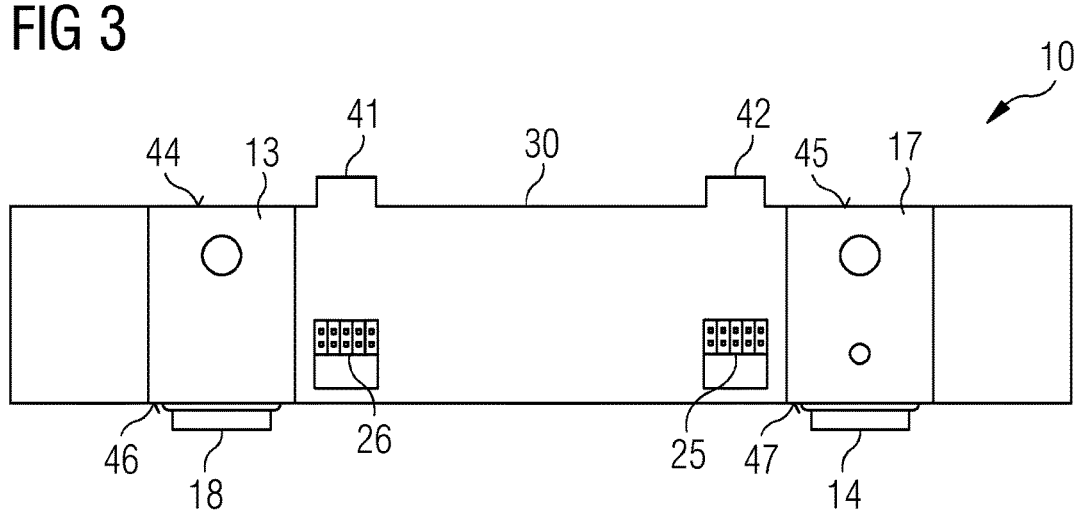
FIG. 3 is a view of the module of FIG. 1 from a side, via which control of electronic components of the module takes place.
Figure 4:
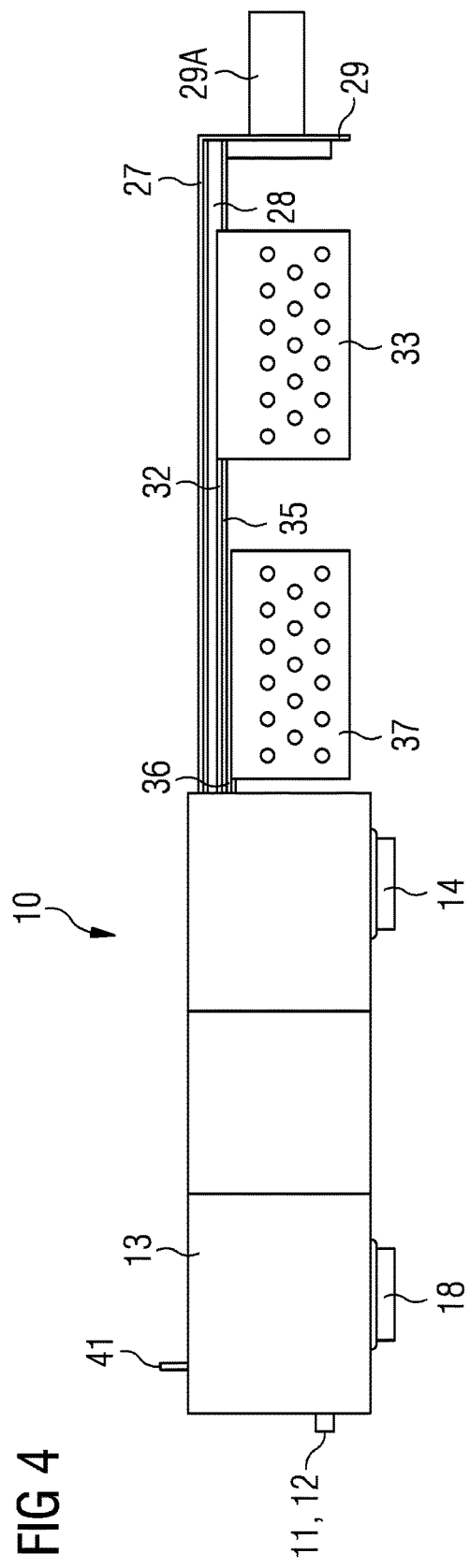
FIG. 4 is a side view of the module of FIG. 1 from a side opposite to the view in FIG. 2.
Figure 5:
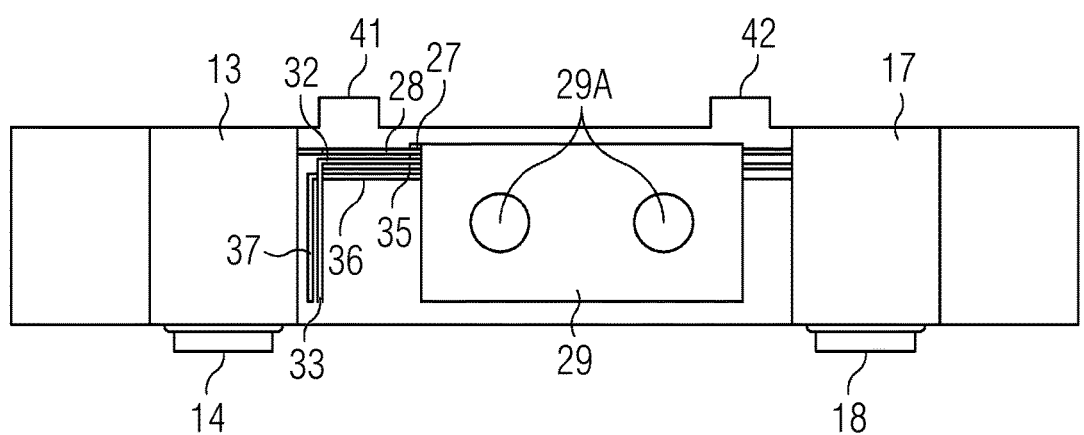
FIG. 5 is a view of the module of FIG. 1 from the side of the load connections.
Figure 6:
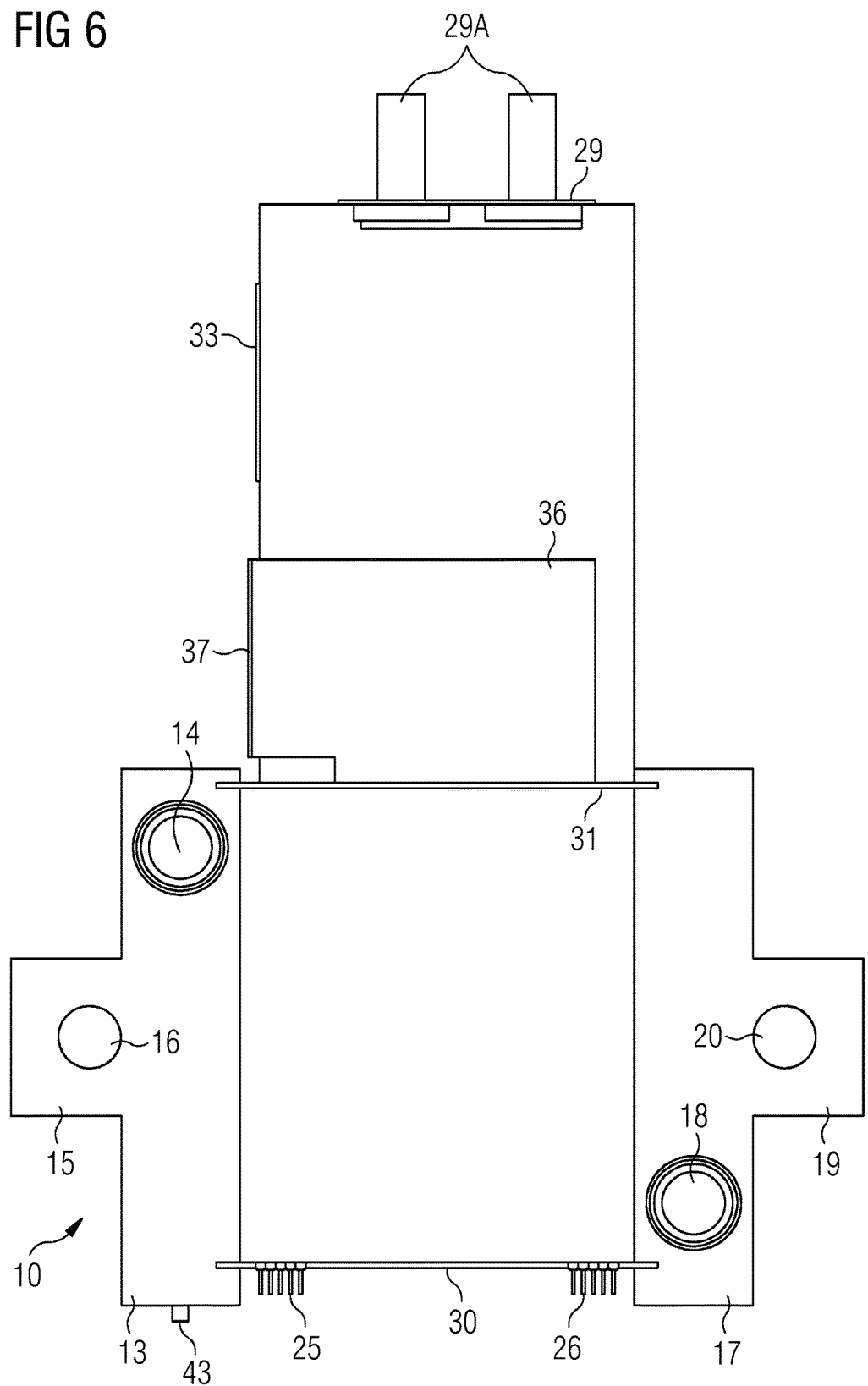
FIG. 6 is a view of the module of FIG. 1 from beneath.

As shown, for example, in the representations of FIGS. 2 and 3, the common supply channel 14 and the common removal channel 18 have at their lower end two connectors protruding beyond the main side of the cooling body 11. These connectors can be inserted into corresponding cut-outs of the common supply channel 14 and of the common removal channel 18 of an adjacent module to form a module group. In order to seal the connection between two adjacent modules 10, the connectors of the common supply channel 14 and of the common removal channel 18 are each surrounded by seals 39, 40 (e.g. O-rings). The seals 39, 40 can be compressed in corresponding cut-outs of the adjacent module of the associated common supply channel and common removal channel.

In the example embodiment of an inventive module 10 shown in FIGS. 1 to 6, the structural supports 13, 17 and cooling bodies 11 may be formed of a ceramic material and may be configured integrally. This means that the cooling body 11 with its receiving surface 12 and the structural supports 13, 17 form a, in particular non-detachable, unit.

In another exemplary embodiment, the structural supports 13, 17 can be made of a different material from the cooling bodies 11 with the receiving surface 12. Preferably, the other material has good thermal conductivity and is mechanically stable. For cost reasons, the construction of the structural support 13, 17 from aluminum or another metal suggests itself. From the design standpoint, the structural supports 13, 17 are connected with a form fit and/or force fit to the cooling body 11 with the receiving surface 12.

In order to be able to connect a plurality of modules 10-1, . . . , 10-n (where n is a fundamentally arbitrary number) to one another to form a module group 100, the structural support 13 has a fastening portion 15 with a bore 16. In a corresponding manner, the structural support 17 has a fastening portion 19 with a bore 20. Purely by way of example, the fastening portions 15, 19 lie opposite one another. The bores 16, 19 extend over the whole height or thickness of the structural support 13, 17 or their fastening portions 15, 19.

Figure 7:
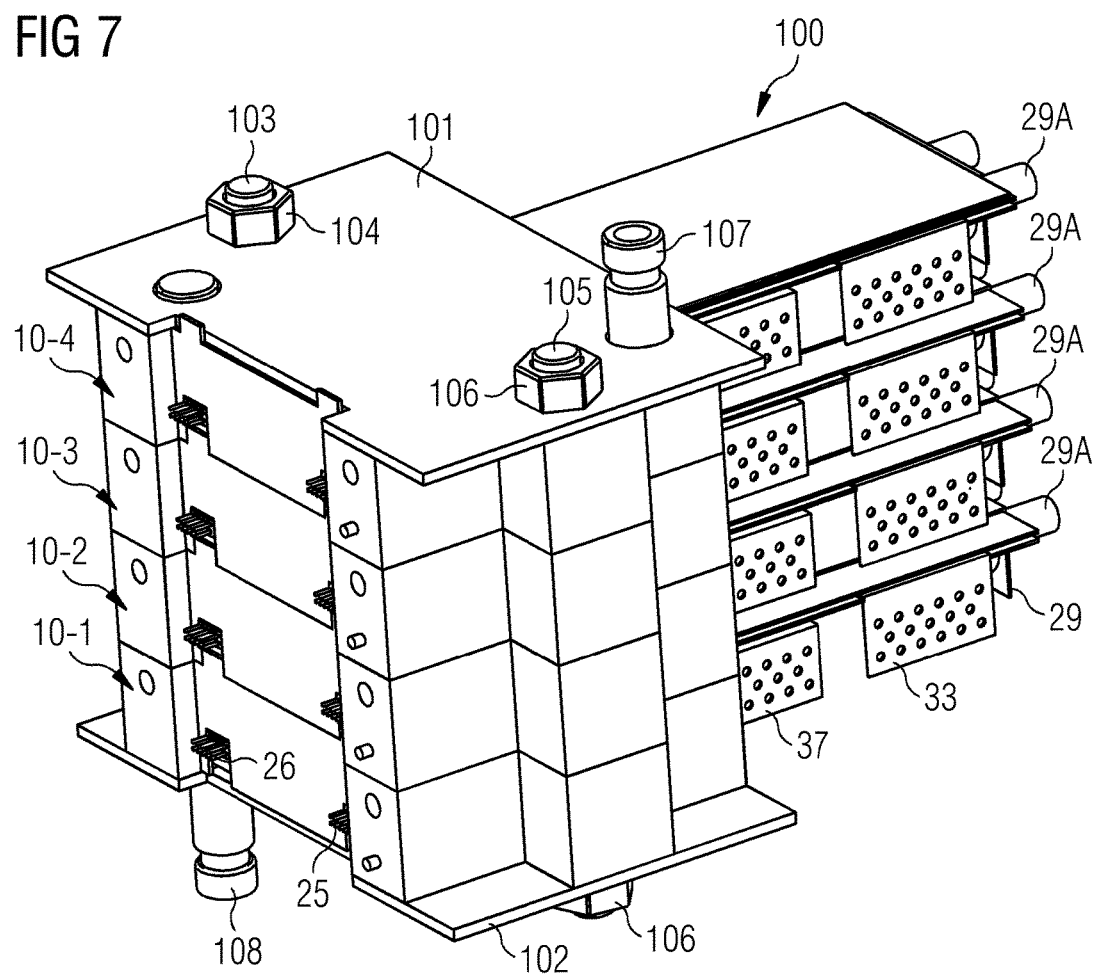
FIG. 7 is a perspective view of a module group including four modules arranged over one another which are configured as shown in FIGS. 1 to 6.

As disclosed by FIG. 7, which shows a module group 100 with, for example, n=4 modules 10-1, . . . , 10-4 stacked over one another, a threaded rod 103 or 105 is guided through each of the bores 16 and 20. As the outer boundary of the module group 100, pressure plates 101 and 102 are arranged in the region of the respective outermost modules 10-1 and 10-4, wherein the threaded rods 103 and 105 also penetrate the pressure plates 101 and 102. The modules 10-1 to 10-4 are clamped to one another by means of nuts 104 and 106 screwed onto the two opposite ends of the threaded rods 103, 105.

In a corresponding manner, it can be deduced from FIG. 7 that the respective common supply channels 14 of the number of modules 10-1 to 10-4 extend over the whole thickness of the module group 100. In a corresponding manner, the common removal channels 18 of the number of modules 10-1 to 10-4 extend over the whole height of the module group 100. A common supply to the module group is identified with the reference numeral 107 and a common outflow of the module group 100 is identified with the reference numeral 108. By means of the arrangement of the common supply 107 on the upper pressure plate 101 and the common outflow 108 on the lower pressure plate 102, it is ensured that an even heat removal from the electronic components of the different modules 10-1 to 10-4 takes place.

Reference will now be made to the configuration of an individual module 10 and to FIGS. 1 to 6. In order to close the depression between the receiving surface 12 and the structural support 13, 17, a respective sealing plate 30, 31 is provided on each of the open sides of the depression. The sealing plates 30, 31 may be formed form an insulating material, for example, a plastics material.

A number of control connections 25, 26 (each in the form of a number of contact pins) penetrates the sealing plate 30. The control connections 25, 26 are electrically and mechanically connected outside the module 10 to a control unit (to be described later). Controllable semiconductor switching elements of the module 10 can be controlled by means of the control connections 25, 26. As can be seen best from FIG.

3, the sealing plate 30 has two protrusions 41, 42 at its upwardly directed end. These protrusions 41, 42 can engage mechanically in corresponding cut-outs or lugs of the sealing plate of the module stacked thereupon, in order to ensure a hermetic seal of the volume of the depression. Also shown in FIG. 3 is that the control connections 25, 26 extend approximately perpendicularly from the plane of the sealing plate 30.

A sheet metal rail 32 of a first supply connection 33 (e.g. of the minus pole), a sheet metal rail 36 of a second supply connection (e.g. of a plus pole) and a sheet metal rail 27 of a load connection 29 extend through the sealing plate 31. As shown best by the side views of FIGS. 2, 4 and 5, arranged between the sheet metal layers 32 and 36 is an insulating layer 35 and between the sheet metal layers 27 and 32 is an insulating layer 28. As also shown by the aforementioned side views, the sheet metal layers 27, and 36 extend in the exemplary embodiment shown here in different lengths laterally out of the cooling body 11, wherein they extend parallel to the plane of the receiving surface 12. The actual contact surfaces, i.e. the first supply connection 33, the second supply connection 37 and the load connection 29 are bent by 90° downwardly relative to the plane of extent of the sheet metal rails 27, 32, 36 (i.e. in the direction of the receiving surface 12). The electrical and/or mechanical contacting of the relevant connections takes place by means of these "lugs". This embodiment is purely exemplary.

The first supply connection 33 and the second supply connection 37 each have a number of bores 34, 38 into which contact pins 113 in a later described carrier 110 are pressed. This can be seen by way of example in FIG. 10. By way of example, two screws or bolts 29A are passed through the load connection 29, so that the load to be supplied can be connected by means of lines (not shown) screwed there onto.

Whereas the sheet metal rails 32, 36 of the supply connections 33, 37 and the sheet metal rail 27 of the load connection 29 are formed from a metal, preferably copper or a copper alloy, the insulating layers 28, 35 are made of an insulating material, for example, Makrolon® or polyethylene (PE).

As shown best by FIG. 1, the end of the sheet metal rail 27 facing away from the load connection 29 is connected to a conductive region 21 on the receiving surface 12 of the ceramic cooling body 11. The connection can take place, for example, by soldering. In corresponding manner, the sheet metal rails 32, 36 of the first and second supply connections 33, 37 can be electrically conductively connected to the conductive regions 22, 23 on the receiving surface 12 on the ceramic cooling body 11.

FIG. 7 shows a perspective view of an exemplary embodiment of a module group 100 with, purely by way of example, four modules 10-1, . . . , 10-4 stacked over one another which are each configured as disclosed in FIGS. 1 to 6. The mechanical connection by means of the threaded rods 103 and 105 and the supply and removal of the coolant have already been described.

From the perspective representation in FIG. 7, it is clearly evident that the control connections 25, 26 of each module 10-1 to 10-4 are directed to the same side of the module group 100. In corresponding manner, the load connections 29 are arranged with the screws 29A and the supply connections 33, 37 on the other side of the module group 100. It can therefore easily be seen that, in particular, the respective supply connections 33 and 37 of the four modules 10-1 to 10-4 stacked over one another lie in a common plane which extends perpendicularly to the plane of the receiving surfaces 12 of the respective modules 10-1 to 10-4 and perpendicularly to the extension direction of the sheet metal rails 27, 32, 36. The plane in which the control connections 25, 26 lie is parallel to the plane in which the load connections 29 with the screws 29A lie.

A module group 100 as shown in FIG. 7 serves, for example, to control one phase of a load (not shown). For this purpose, the electronic components of each module 10-1 to 10-4 are controlled with the aid of a control circuit together and in parallel, so that a corresponding load current which is fed to the phase of the load is available at the load connections 29. By means of the number of modules 10 stacked over one another, the maximum possible power from a module group 100 can be set.

In another embodiment, it is also possible to connect different phases of one or more loads to the load connections of different modules 10-1 to 10-4.

Figure 8:
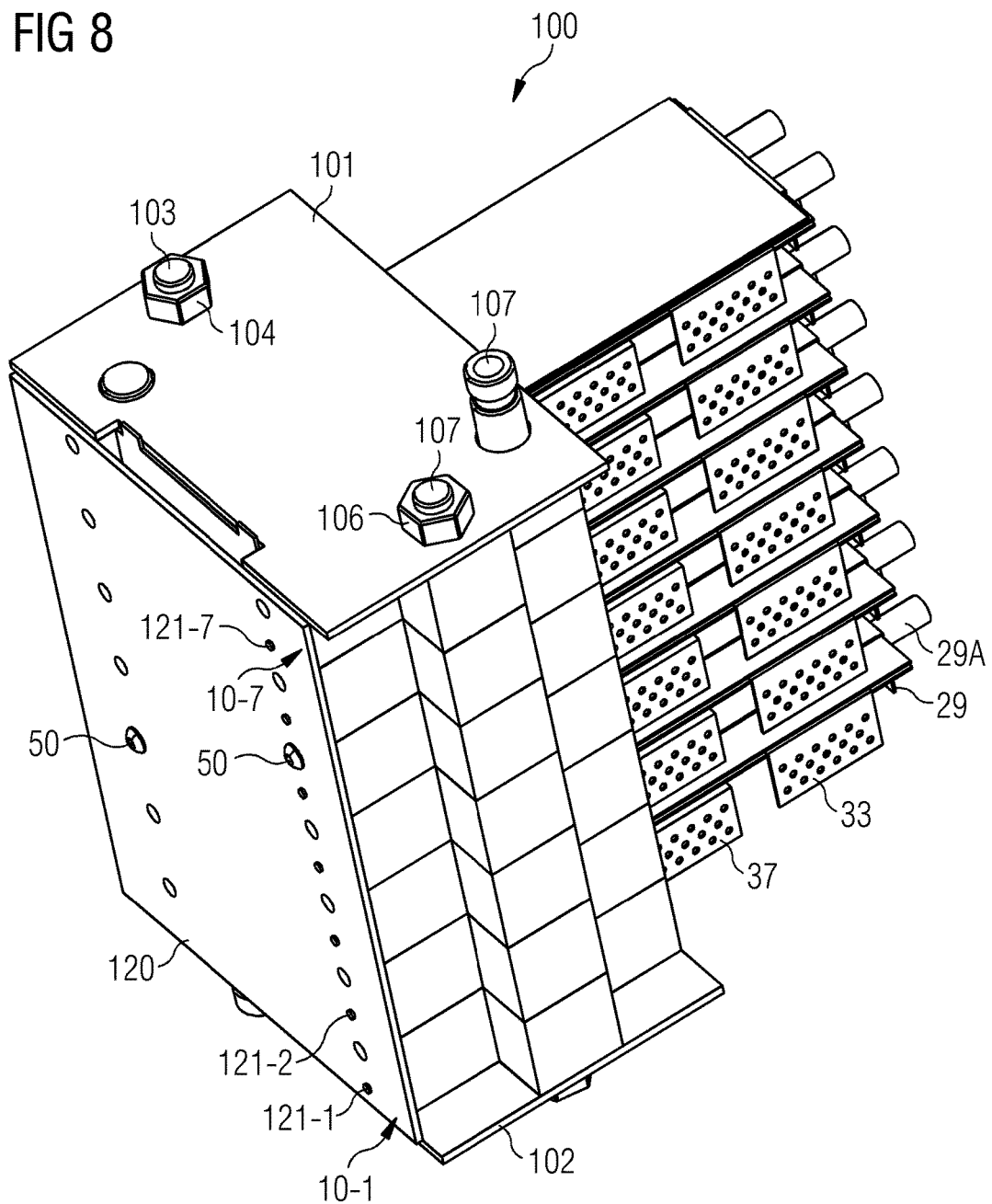
FIG. 8 is a perspective representation of a module group with a total of seven modules stacked over one another which is configured in accordance with FIGS. 1 to 6, wherein a second carrier for a control unit is connected to the modules.

FIG. 8 shows a perspective view of a module group 100 with, by way of example, seven identical modules 10-1, . . . , 10-7 stacked over one another. A carrier, for example, a circuit board on which components of the control unit (not shown) are mounted is identified with the reference numeral 120. On the rear side (not visible in FIG. 8), the control connections 25, 26 are electrically and mechanically connected by means of corresponding contact elements. Positioning of the carrier 120 takes place via the positioning posts 43 arranged on each module 10 (or more exactly, the structural support 13), which engage in corresponding cut-outs 121 of the carrier 120. The components of the control unit are arranged on the main side of the carrier 120 facing toward the viewer.

As can be readily seen from this representation, the main plane of the carrier 120 of the control unit is arranged perpendicularly to the plane of the receiving surfaces 12 of the modules 10-1 to 10-7 of the module group 100.

Shown in FIGS. 9 to 12 is an exemplary embodiment of an inventive converter 1 with three module groups 100-1, 100-2, 100-3 as described above, from three different perspectives. The module group 100-1 serves herein to provide a current for a first phase of a load (not shown). In corresponding manner, the module group 100-2 provides the current for a second phase of the load and the module group 100-3 provides the current for a third phase of the load. The converter 1 is, for example, a B6 converter. This means that each module group 100-1, 100-2, 100-3 is configured as a half-bridge. The electrical components of each module 10 of each module group 100-1, 100-2, 100-3 are connected in parallel.

Purely by way of example, each module group 100-1 has seven (i.e. n=7) modules stacked over one another, as described in relation to FIGS. 1 to 6. The number n could naturally be selected to be different.

As shown in the plan view of FIG. 9, the module groups 100-1, 100-2 and 100-3 are mechanically and electrically connected by means of their load connections 29 to corresponding contact pins 113 on the aforementioned carrier 110. This type of contacting which can take place with the aid of cold welding is better seen from the side view of FIG. 10. In FIG. 9, a conductive layer 111 is arranged on the main side of the carrier 110 facing toward the viewer. This conductive layer 111 arranged on the main side of the carrier 110 serves for electrical screening.

As shown in the side view of FIGS. 10 and 11, arranged on the other main side of the carrier 110 is a plurality of capacitors 112 which are the DC link capacitors. It is clearly apparent that the main plane of the carrier 110 on which the (parallel connected) DC link capacitors are disposed is arranged perpendicularly to the plane of the receiving surfaces of the modules 10 of each module group 100-1, 100-2, 100-3.

As shown, for example, in the view from underneath in FIG. 12, each module group 100-1, 100-2, 100-3 is supplied with coolant from a dedicated cooling circuit. By this means, even cooling of all the electronic components of all the module groups 100-1, 100-2, 100-3 is enabled.

From the representations of FIGS. 9 and 10, it is particularly clear that the principle realized here of arranging the electronic components of one or more phases in a first level, arranging the DC link capacitors on a carrier, arranging the main plane of the carrier perpendicularly to the plane of the receiving surface of the electronic components of the individual modules and arranging the control unit on a carrier, the main plane of said carrier also being arranged perpendicularly to the plane of the receiving surface, enables a particularly compact converter 1 constructed in a modular manner, as desired.

In the exemplary embodiment shown here, the three planes mentioned each lie perpendicularly to one another. In a derivation, it could also be provided to rotate the module groups 100-1, 100-2 and 100-3 relative to the main plane of the carrier 110 such that the main plane of the carrier 110 lies parallel to the main planes of the carriers 120-1, 120-2 and 120-3 for the respective control units of the module groups 100-1, 100-2 and 100-3. This requires only an adaptation in the region of the embodiment of the sheet metal rails 32, 36 and 27 and the associated load connections 33, 37 and 29.

This compact and space-saving arrangement is enabled by the use of ceramic cooling bodies of the modules. In that these can be stacked over one another in any desired number, by means of a parallel connection, the power output of a respective module group can be scaled. The stacking of the individual modules leads to an efficient assembly since no additional effort is required with respect to cooling connections of the individual cooling bodies. Furthermore, a cooling of the control unit can take place via the carrier 120 and the direct contact with the end sides of the structural supports 13, 17.

By means of the aforesaid arrangement of the planes to one another, parasitic inductances can also be minimized due to short power connections. In particular, by this means, small commutation cells can be realized in each module. A tendency toward oscillation can be realized by a damping resistor in conjunction with the DC link capacitors 112. The damping resistor can be provided on the receiving surface 12 of each module 10.

With a parallel connection of a plurality of modules in a module group, regardless of the number of the modules in the module group, only one driver layout of the control unit needs to be provided. Preferably, the carrier 120 is provided in the Eurocard format (i.e. with a size of 100 mm×160 mm), so that through a multi-layered construction, short conduction paths can be realized for the synchronization of run times. If required, individual plug-in slots can remain free, if the number of modules in a module group is too small. The electronic components of the control unit provide for a low-inductance identical (i.e. synchronous) control of the individual modules. Easy assembly of the control unit is provided by plug-in mounting with the control connections 25, 26. The optimum connection of the carrier 120 to the structural support 13, 17 is carried out with holding screws in order to generate an optimum pressing force for the cooling. These holding screws are identified in FIG. 8 with the reference numeral 50.

Due to the possibility of realizing the sheet metal rails 27, 32 and 36 with a large area and parallel to one another, a desired reduction in parasitic inductances is achieved. Furthermore, a large current carrying capacity is ensured, to minimize losses. This makes it possible to switch the electronic components, in particular the semiconductor switching elements, at a high frequency.

What is claimed is:

1. A converter with a DC link for converting an input voltage into an alternating voltage with a pre-determined amplitude and frequency for driving a single or multiple-phase load, the converter comprising:
   a plurality of modules configured to be stackable over one another, wherein each module comprises a ceramic cooling body with a planar receiving surface having electronic components of one phase mounted thereon, wherein the ceramic cooling body has one or more channels passing through the planar receiving surface for carrying a coolant during an operation of the converter;
   at least one DC link capacitor and input-side and output-side power connections arranged on a first carrier extending perpendicular to a plane of the plurality of receiving surfaces;
   a control unit arranged on a second carrier extending parallel to the plane of the first carrier, the control unit configured to drive the electronic components of the phase;
   a structural support arranged on each of two opposing sides of the receiving surface, wherein the structural supports protrude, in a direction perpendicular to the receiving surface, beyond the receiving surface, such that the electronic components lie in a depression formed between the receiving surface and the structural supports;
   wherein the coolant is supplied to the one or more channels through a portion of the structural supports extending parallel to the planar receiving surface; and
   a sealing plate on each side of the depression and configured to close the depression, each sealing plate comprising a passage for control connections or supply and load connections.

2. The converter of claim 1, comprising,
   wherein the structural supports have contact portions for engaging an adjacent module.

3. The converter of claim 1, wherein the cooling body has a thickness of between 3 mm and 5 mm in the region of the receiving surface in a direction perpendicular to the plane of the receiving surface.

4. The converter of claim 1, wherein the structural supports have a thickness of between 15 mm and 20 mm in a direction perpendicular to the plane of the receiving surface.

5. The converter of claim 1, wherein the coolant is supplyable to and removable from the channel or channels of the cooling body via at least one of the structural supports.

6. The converter of claim 5, comprising:
   a common supply channel configured to supply the coolant to the channel or channels of the cooling body, the colon supply channel being provided in at least one structural support, and extending perpendicular to the plane of the receiving surface and;
   a common removal channel configured to remove the coolant, the common removal channel extending perpendicularly to the plane of the receiving surface,
   wherein respective volumes of the common supply channel and the common removal channel are much greater than a volume of the channel or channels arranged in the region of the receiving surface.

7. The converter of claim 1, wherein the structural support or supports are made of a ceramic material and formed integrally with the cooling body.

8. The converter of claim 1, wherein the structural supports are made of a different material from the cooling bodies and are connected to each other by at least one of a form fit or a force fit.

9. The converter of claim 1, wherein the control connections pass through a first of the sealing plates, and wherein the control connections are connected mechanically and electrically outside the module to the second carrier by a plug-in connection.

10. The converter of claim 1, wherein the supply connections and the load connection pass through a second of the sealing plates, and wherein the supply connections are connected mechanically and electrically outside the module to a first main side of the first carrier.

11. The converter of claim 10, wherein the DC link capacitor or capacitors are arranged on a second main side of the first carrier.

12. The converter of claim 1, wherein a first and a second supply connection are formed by sheet metal rails arranged over one another and separated from one another by an insulating layer.

13. The converter of claim 1, wherein the load connection is configured as a further sheet metal rail that is guided over the sheet metal rails of the supply connections and is separated from the sheet metal rails by an insulating layer.

14. The converter of claim 1, wherein a plurality of modules arranged over one another are mechanically connected to one another to form a module group.

15. The converter of claim 14, comprising a number of module groups corresponding to the number of phases.

16. The converter of claim 14, wherein each module group is connected to a respective common second carrier.

* * * * *